US012733303B2

(12) United States Patent
Vehonsky et al.

(10) Patent No.: US 12,733,303 B2
(45) Date of Patent: Sep. 8, 2026

(54) IC PACKAGE WITH MICRO LEDS

(71) Applicant: Intel Corporation, Santa Clara, CA (US)

(72) Inventors: Jacob Vehonsky, Gilbert, AZ (US); Onur Ozkan, Scottsdale, AZ (US); Vinith Bejugam, Chandler, AZ (US); Mao-Feng Tseng, Tempe, AZ (US); Nicholas Haehn, Scottsdale, AZ (US); Andrea Nicolas Flores, Chandler, AZ (US); Ali Lehaf, Phoenix, AZ (US); Benjamin Duong, Phoenix, AZ (US); Joshua Stacey, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 200 days.

(21) Appl. No.: 17/903,126

(22) Filed: Sep. 6, 2022

(65) Prior Publication Data

US 2024/0079530 A1 Mar. 7, 2024

(51) Int. Cl.

| | |
|---|---|
| ***H10H 20/85*** | (2025.01) |
| ***H10H 20/01*** | (2025.01) |
| ***H10H 20/854*** | (2025.01) |
| ***H10H 20/856*** | (2025.01) |
| ***H10H 20/857*** | (2025.01) |
| ***H10W 70/692*** | (2026.01) |
| ***H10W 90/00*** | (2026.01) |

(52) U.S. Cl.
CPC ........ *H10H 20/8506* (2025.01); *H10H 20/01* (2025.01); *H10H 20/856* (2025.01); *H10H 20/857* (2025.01); *H10H 20/0363* (2025.01); *H10H 20/0364* (2025.01)

(58) Field of Classification Search
CPC ............. H10H 20/857; H10H 20/0364; H10H 20/8506; H01L 25/0753; H10W 90/00; H10W 70/692
See application file for complete search history.

(56) References Cited

U.S. PATENT DOCUMENTS

| | | | | |
|---|---|---|---|---|
| 2006/0043402 | A1* | 3/2006 | Suehiro | H10H 20/82 257/E33.059 |
| 2019/0287949 | A1* | 9/2019 | Chong | H01L 25/0756 |
| 2021/0036059 | A1* | 2/2021 | Leng | H01L 23/645 |
| 2024/0222575 | A1* | 7/2024 | Wang | H10H 20/831 |

* cited by examiner

*Primary Examiner* — Antonio B Crite
(74) *Attorney, Agent, or Firm* — Schwabe, Williamson & Wyatt, P.C.

(57) ABSTRACT

Embodiments of an integrated circuit (IC) package are disclosed. In some embodiments, the IC package includes a semiconductor die, a glass substrate, and a package substrate. The semiconductor die includes a micro light emitting diode (LED). The semiconductor die is at least partially embedded within the glass substrate and the glass substrate including a through glass via (TGV) embedded in the glass substrate wherein the TGV is electrically coupled to the semiconductor die to provide power to the micro LED. The package substrate that is coupled to the TGV.

14 Claims, 12 Drawing Sheets

102

102
412
410
408
406
404
402

102
412
414
410

102
140
416
138

136
134
132
130

102
104

102
122
128
118
124

302

302
512
510
508
506
504
502

302
340
338
336
334
332
330

302
340
516
304
338
514

306
302
308
340
346
342
344

IC PACKAGE WITH MICRO LEDS

BACKGROUND

Certain electronic devices, such as do it yourself (DIY) electronic devices often utilize micro light emitting diodes (LEDs) as either aesthetic components of the electronic device or to indicate certain operations being performed by the electronic device. In some cases, customers of these electronic devices are willing to pay extra in order to customize their electronic devices with micro LEDs. Adding micro LEDs to additional components within the electronic device thus can increase profit margins for these electronic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
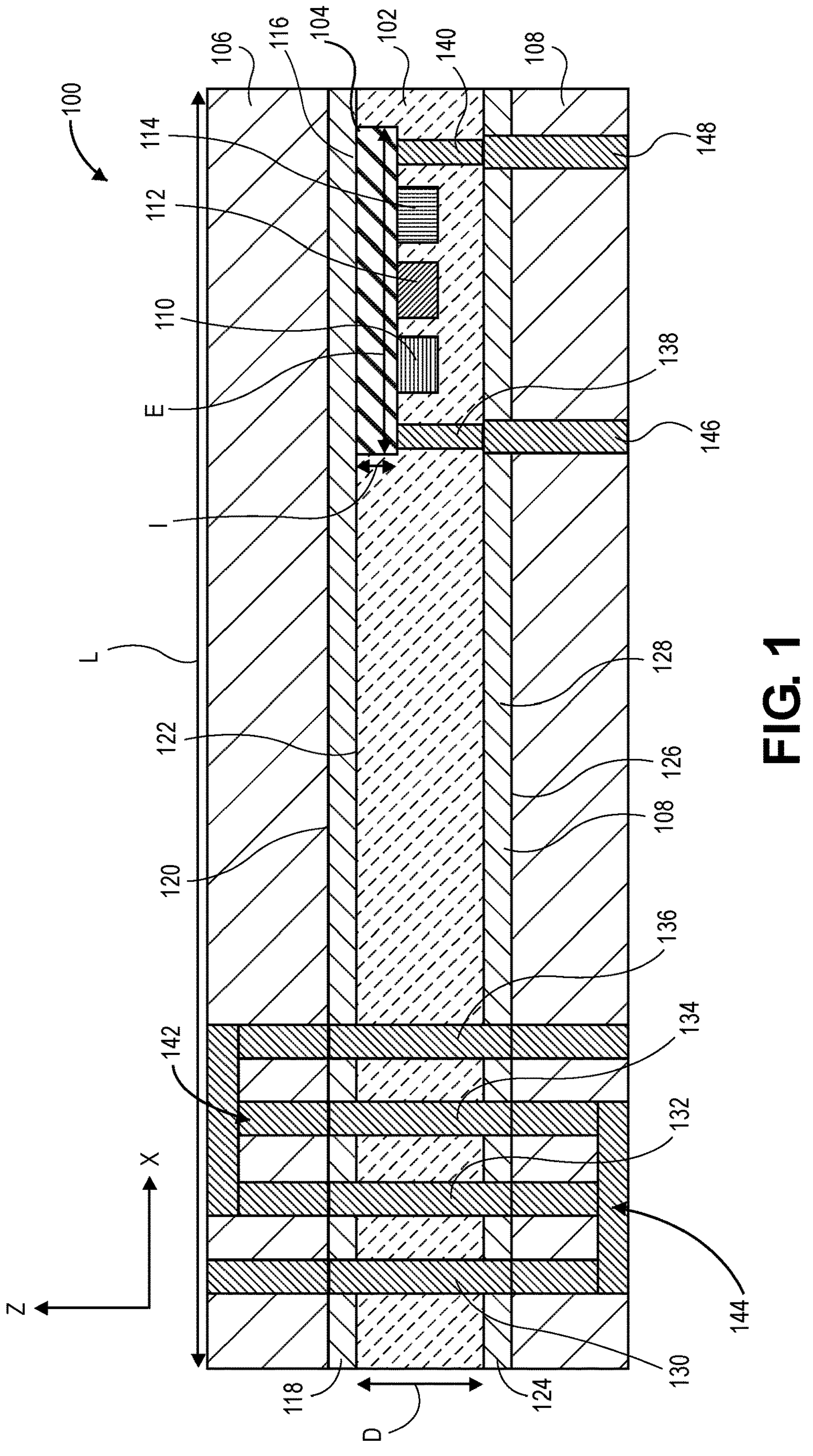
FIG. 1 illustrates an embodiment of an integrated circuit (IC) package 100, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not dictate a relationship between the various embodiments and/or configurations discussed.

(Optional, use when applicable) Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

These micro LEDs could be used as an extra aesthetic component, as in situ electrical test indicators, and/or enable light up wording across a central processing unit (CPU). FIG. 1 illustrates an embodiment of an integrated circuit (IC) package 100, in accordance with some embodiments.

The IC package 100 includes a glass substrate 102, a semiconductor die 104, a package substrate 106, and a package substrate 108. The semiconductor die 104 includes micro light emitting diodes (LEDs) 110, 112, 114. In some embodiments, the micro LEDs 110, 112, 114 each include one or more nanowires. In some embodiments, the micro LEDs 110, 112, 114 each emit a different color of light. For example, in one embodiment, the micro LED 110 emits a blue color of light, the micro LED 112 emits a green color of light, and the micro LED 114 emits a red color of light. In other embodiments, the micro LEDs 110, 112, 114 each emit the same color of light. In some embodiments, the semiconductor die 104 includes a bottom layer, a semiconductor body (semiconductor core), a top layer, and microbumps on the top layer. The semiconductor die 104 has a semiconductor body that is formed from, in at least one embodiment, silicon, silicon germanium (SiGe), gallium arsenic, gallium nitride, or other suitable semiconductor materials.

In this embodiment, the semiconductor die 104 is partially embedded within the glass substrate 102. More specifically, the semiconductor die 104 is embedded within the glass substrate 102 except that a back surface 116 of the semiconductor die 104 is exposed from the glass substrate 102. In other embodiments, the semiconductor die 104 is fully embedded within the glass substrate 102.

In this embodiment, the package substrate 106 and the package substrate 108 are formed from a polymer. A silicon nitride (SiN) layer 118 is formed on a surface 120 of the package substrate 106. The surface 120 of the package substrate 106 is attached to the SiN layer 118. A surface 122 of the glass substrate 102 is attached to the SiN layer 118. A surface 116 of the semiconductor die 104 is attached to the SiN layer 118.

A SiN layer 124 is formed on a surface 126 of the package substrate 108. The surface 126 of the package substrate 108 is attached to the SiN layer 124. The surface 120 of the package substrate 106 faces the surface 126 of the package substrate 108. A surface 128 of the glass substrate 102 is attached to the SiN layer 124. The surface 122 of the glass substrate 102 is opposite the surface 128 of the glass substrate 102.

Through glass vias (TGVs) 130, 132, 134, 136, 138, 140 are embedded in the glass substrate 102. In this embodiment, the TGVs 130, 132, 134, 136 are connected to a conductive structure 142 embedded within the package substrate 106 and are connected to a conductive structure 144 embedded within the package substrate 108. The conductive structure 142 embedded within the package substrate 106 distributes input and output signals to and from the semiconductor die 104. The conductive structure 144 embedded within the package substrate 108 distributes input and output signals to and from a motherboard (not shown). The TGVs 130, 132, 134, 136 electrically couple the conductive structure 142 to the conductive structure 144. The TGVs 138, 140 are directly connected to the semiconductor die 104 to provide power the micro LEDs 110, 112, 114.

More specifically, the package substrate 108 includes vias 146, 148. The via 146 is configured to receive a power source voltage from the motherboard. The via 148 is configured to receive a ground voltage from the motherboard. The via 146 is electrically connected to the TGV 138. The via 148 is connected is connected to the TGV 140. The TGV 138 is connected to the semiconductor die 104 and the TGV 140 is connected to the semiconductor die 104. In this manner, power signals are received from the motherboard and transmitted to the semiconductor die 104 to power the micro LEDs 110, 112, 114 formed on the semiconductor die 104.

The glass substrate 102 defines a length L parallel to an X-axis and a thickness D parallel to a Z-axis that is orthogonal to the X-axis. The semiconductor die 104 defines a length parallel E to the X-axis and a thickness I parallel to the Z-axis. Thus the length L of the glass substrate 102 is parallel to the length E of the semiconductor die 104 and a thickness D of the glass substrate 102 is parallel to the thickness I of the semiconductor die 104.

Figure 2:
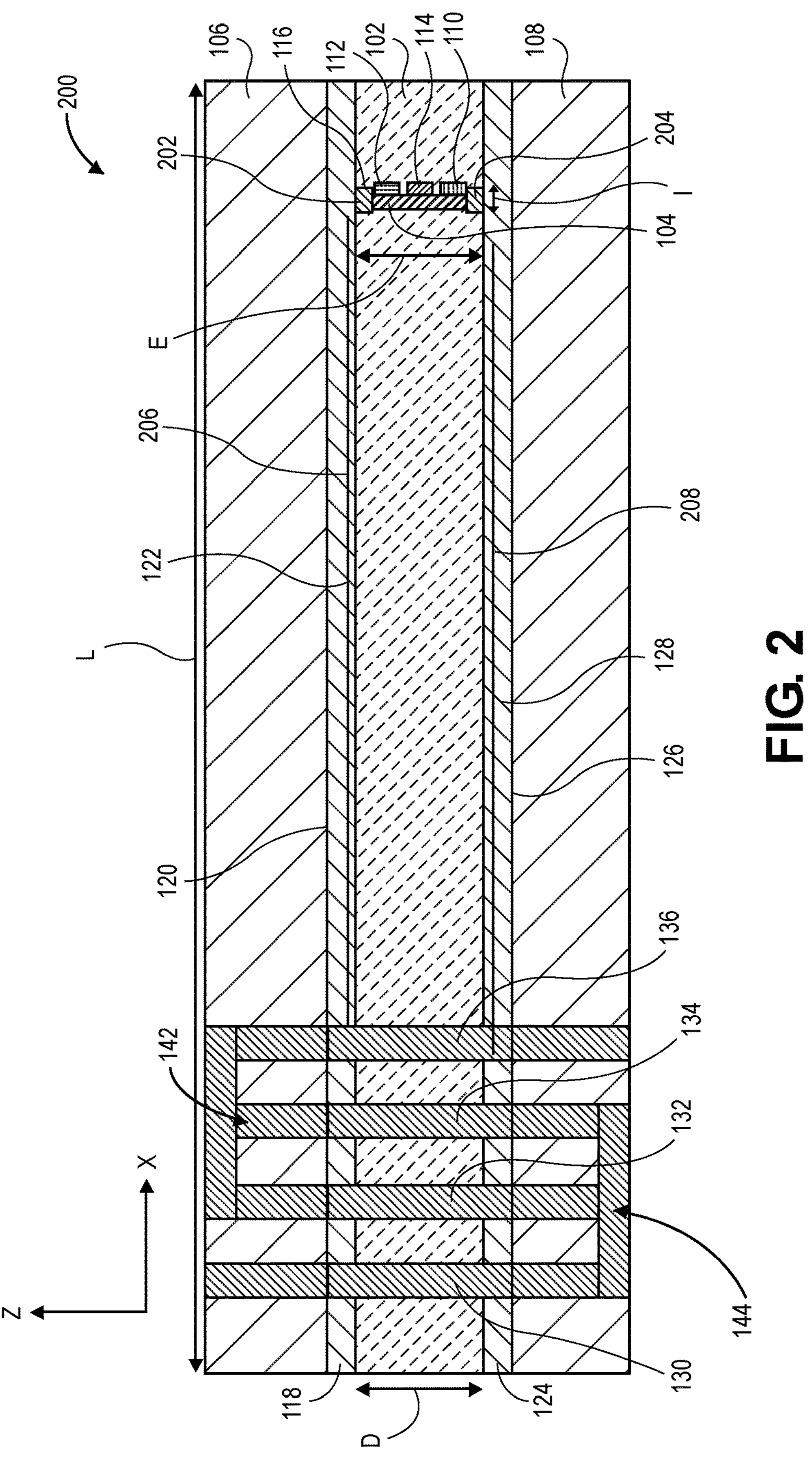
FIG. 2 is an embodiment of an IC package 200, in accordance with some embodiments.

FIG. 2 is an embodiment of an IC package 200, in accordance with some embodiments.

The IC package 200 in FIG. 2 is similar to the IC package 100 in FIG. 1, except for the arrangement of the TGVs 134, 136, the conductive structure 144, and the IC package 100. The discussion thus focuses on the components of the IC package 200 in FIG. 2 that are different from the IC package 100 in FIG. 1.

In FIG. 2, the semiconductor die 104 is fully embedded in the glass substrate 102. The semiconductor die 104 defines a length parallel E to the Z-axis and a thickness I parallel to the X-axis. Thus the length L of the glass substrate 102 is orthogonal to the length E of the semiconductor die 104 and a thickness D of the glass substrate 102 is orthogonal to the thickness I of the semiconductor die 104.

In this embodiment, the conductive structure 144 is used to receive and distribute a power source voltage and a ground voltage from a motherboard (not explicitly shown). The TGV 136 is configured to receive a power source voltage from the conductive structure 142 and the TGV 134 is configured to receive a ground voltage from the conductive structure 144. The semiconductor die 104 includes a contact 202 where a trace 206 connects the TGV 136 to the contact 202. The semiconductor die 104 includes a contact 204 where a trace 208 connects the TGV 136 to the contact 204. In FIG. 2, the traces 206, 208 are formed on the surfaces 122, 128 (respectively) of the glass substrate 102. In other embodiments, the traces 206, 208 are formed on the SiN layers 118, 124 (respectively) and routed to the contacts 202, 204 (respectively).

Figure 3:
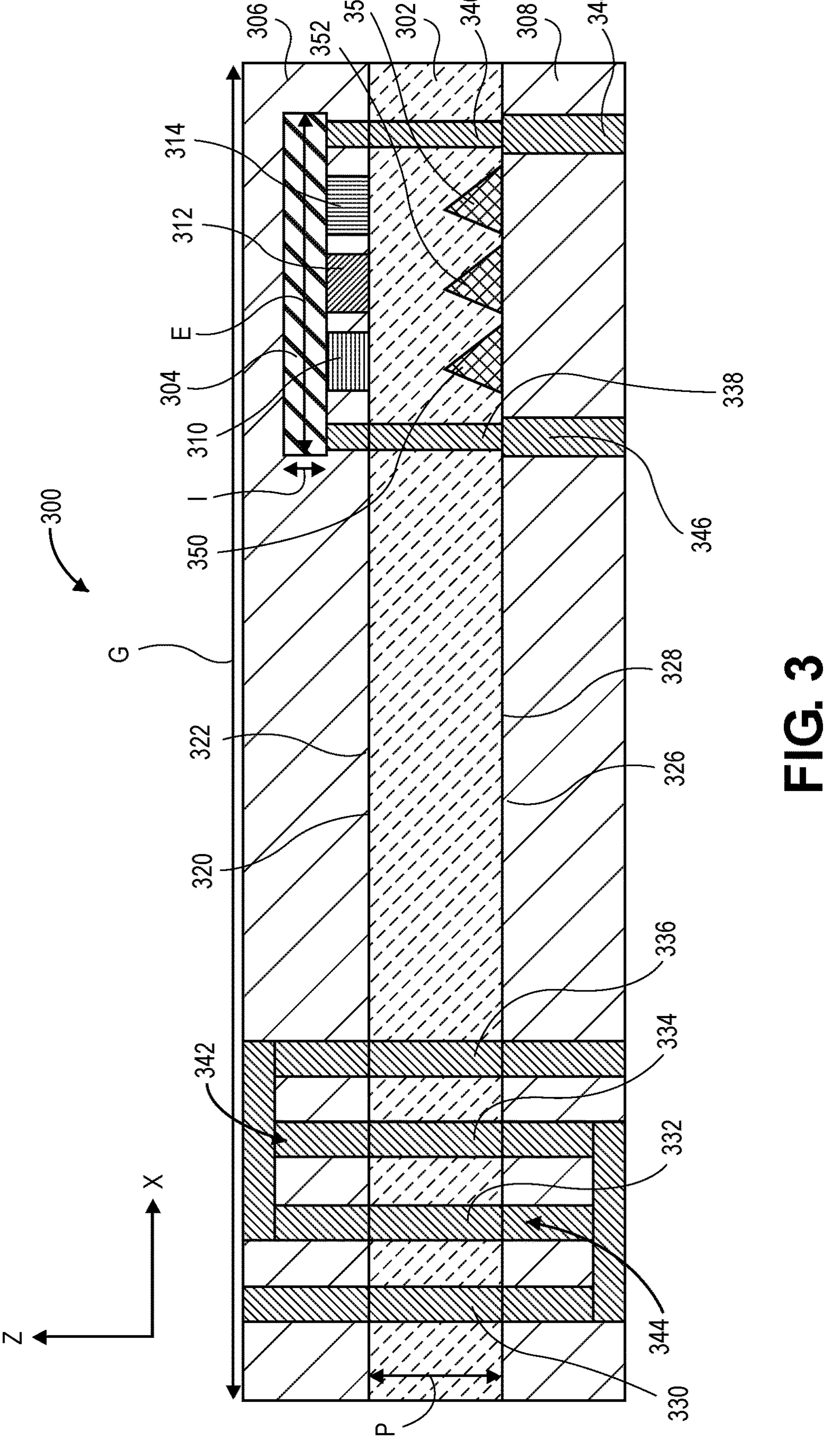
FIG. 3 illustrates an embodiment of an IC package 300, in accordance with some embodiments.

FIG. 3 illustrates an embodiment of an IC package 300, in accordance with some embodiments.

The IC package 300 includes a glass substrate 302, a semiconductor die 304, a package substrate 306, and a package substrate 308. The semiconductor die 304 includes LEDs 310, 312, 314. The semiconductor die 304 has a semiconductor body that is formed from, in at least one embodiment, silicon, SiGe, gallium arsenic, gallium nitride, or other suitable semiconductor materials. In some embodiments, the micro LEDs 310, 312, 314 each include one or more nanowires. In some embodiments, the micro LEDs 310, 312, 314 each emit a different color of light. For example, in one embodiment, the micro LED 310 emits a blue color of light, the micro LED 312 emits a green color of light, and the micro LED 314 emits a red color of light. In other embodiments, the micro LEDs 310, 312, 314 each emit the same color of light.

In this embodiment, the semiconductor die 304 is fully embedded within the package substrate 306. In other embodiments, the semiconductor die 304 is partially embedded within the package substrate 306.

In this embodiment, the package substrate 306 and the package substrate 308 are formed from a molding that is formed from a dielectric material. The surface 320 of the package substrate 306 is attached to a surface 322 of the glass substrate 302.

A surface 326 of the package substrate 308 is attached to a surface 328 of the glass substrate 302. The surface 320 of the package substrate 306 faces the surface 326 of the package substrate 308.

TGVs 330, 332, 334, 336, 338, 340 are embedded in the glass substrate 302. In this embodiment, the TGVs 330, 332, 334, 336 are connected to a conductive structure 342 embedded within the package substrate 306 and are connected to a conductive structure 344 embedded within the package substrate 308. The conductive structure 342 embedded within the package substrate 306 distributes input and output signals to and from the semiconductor die 304. The conductive structure 344 embedded within the package substrate 308 distributes input and output signals to and from a motherboard (not shown). The TGVs 330, 332, 334, 336 electrically couple the conductive structure 342 to the conductive structure 344. The TGVs 338, 340 are directly connected to the semiconductor die 304 to provide power the micro LEDs 310, 312, 314.

More specifically, the package substrate 308 includes vias 346, 348. The via 346 is configured to receive a power source voltage from the motherboard. The via 348 is configured to receive a ground voltage from the motherboard. The via 346 is electrically connected to the TGV 338. The via 348 is connected is connected to the TGV 340. The TGV 338 is connected to the semiconductor die 304 and the TGV 340 is connected to the semiconductor die 304. In this manner, power signals are received from the motherboard and transmitted to the semiconductor die 304 to power the micro LEDs 310, 312, 314 formed on the semiconductor die 304.

The package substrate 306 defines a length G parallel to the X-axis and a thickness P parallel to the Z-axis. The semiconductor die 304 defines a length parallel E to the X-axis and a thickness I parallel to the Z-axis. Thus the length G of the package substrate 306 is parallel to the length E of the semiconductor die 304 and the thickness P of the glass substrate 302 is parallel to the thickness I of the semiconductor die 304. In this embodiment, mirrors 350, 352, 354 are formed on the surface 326 of the package substrate 308. The mirrors 350, 352, 354 are configured so that light from the micro LEDs 310, 312, 314 is reflected out of the IC package 300 through the glass substrate 302.

FIG. 4A-4G illustrate a method of manufacturing an IC package, in accordance with some embodiments.

In some embodiments, FIG. 4A-4G describe a method of manufacturing the IC package 100 in FIG. 1. However, FIG. 4A-4G are also relevant to manufacturing the IC package 200 in FIG. 2.

Figures 4A, 4B:
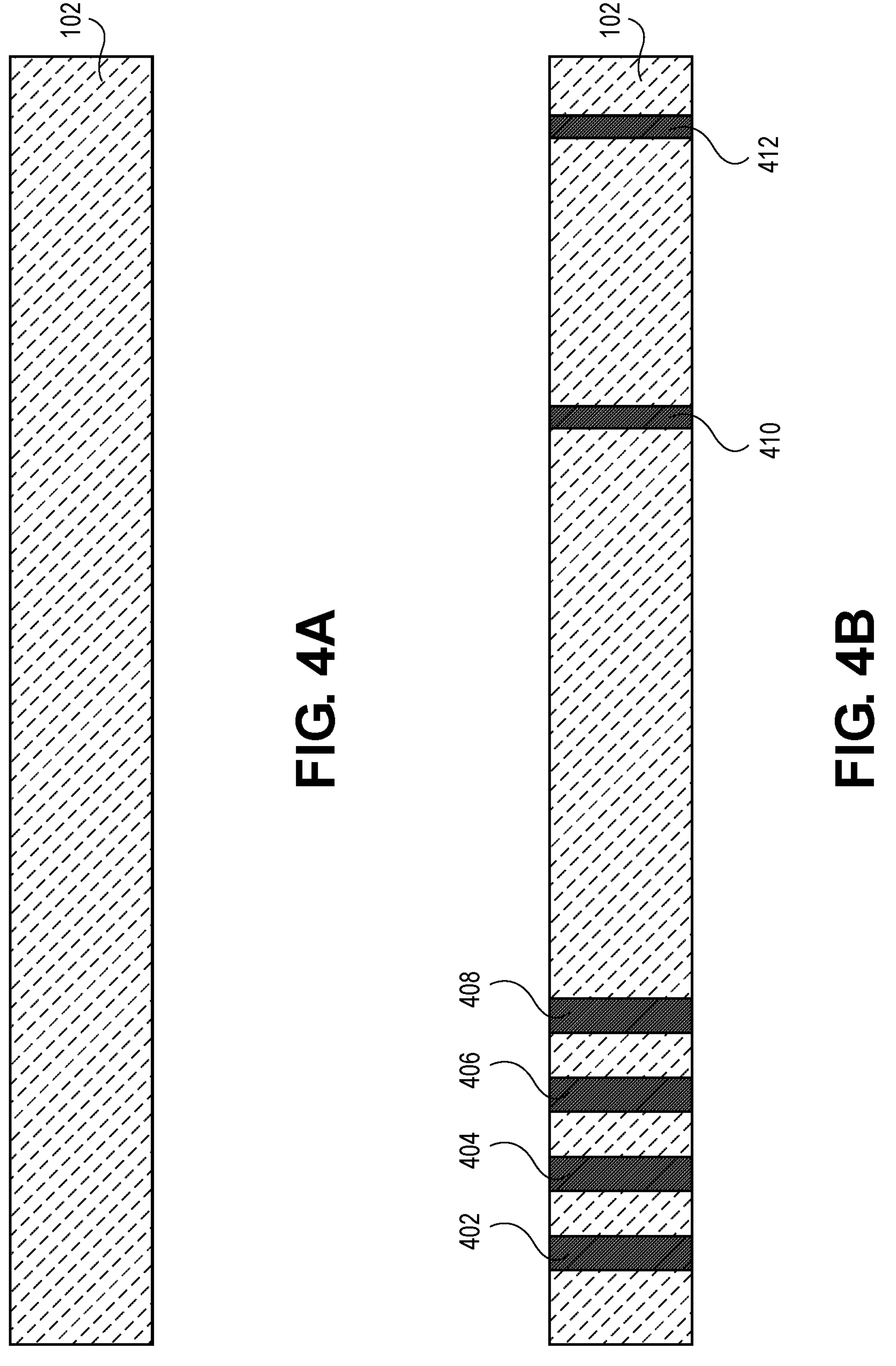
FIG. 4A-4G illustrate a method of manufacturing an IC package, in accordance with some embodiments.

At FIG. 4A, a glass substrate 102 is provided. In some embodiments, the glass substrate 102 is fabricated. In other embodiments, the glass substrate 102 is obtained from another party.

At FIG. 4B, glass via cavities 402, 404, 406, 408, 410, 412 are formed in the glass substrate 102. In some embodiments, the glass via cavities 402, 404, 406, 408, 410, 412 are formed by laser treating and etching the glass substrate 102 to form the glass via cavities 402, 404, 406, 408, 410, 412.

Figures 4C, 4D:
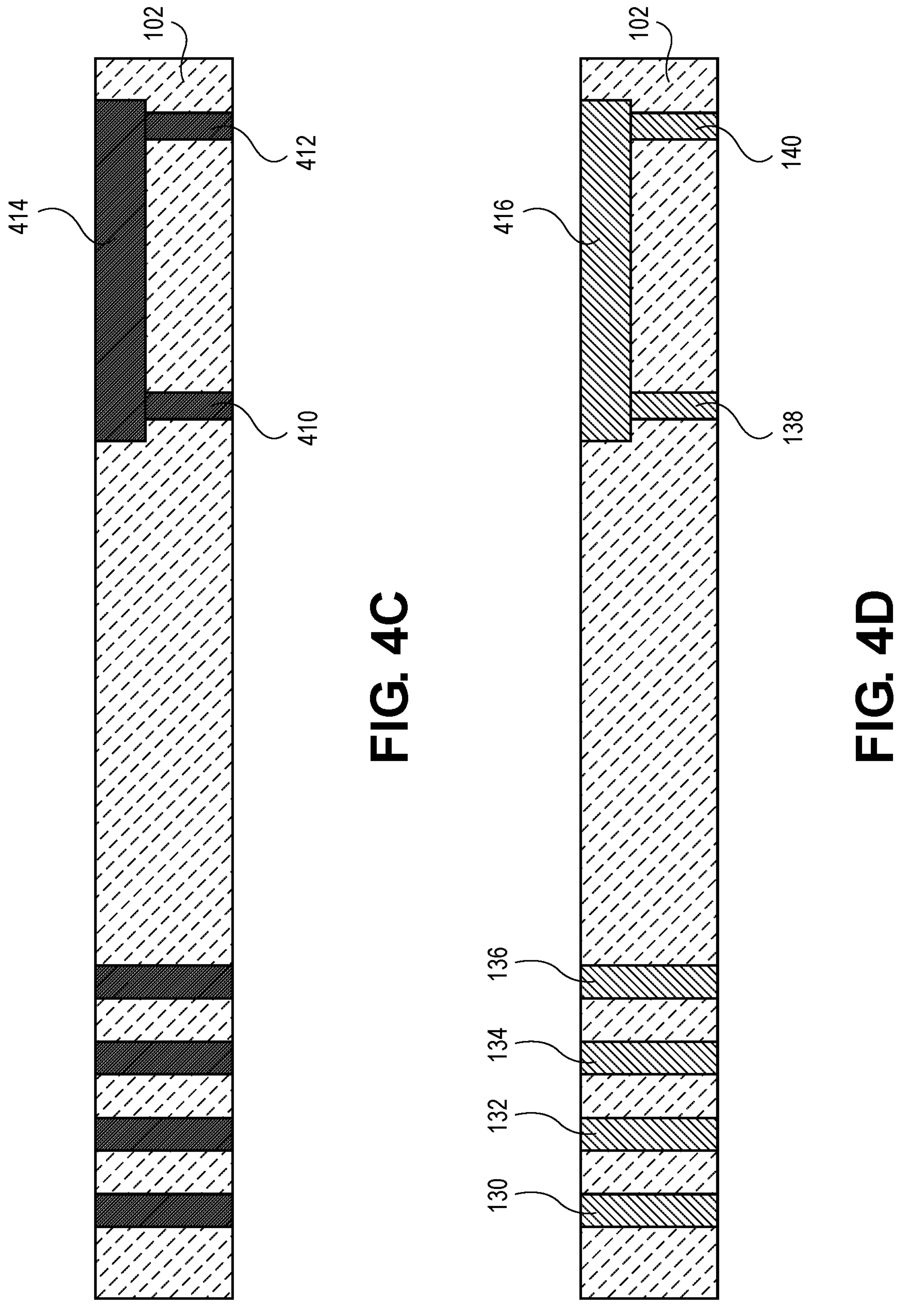

At FIG. 4C, a body cavity 414 if formed in the glass substrate 102 where the glass via cavities 410, 412 were formed. The body cavity 414 is formed from the surface 122 of the glass substrate and shaped like the semiconductor die 104 (See FIG. 1).

At FIG. 4D, TGVs 130, 132, 134, 136, 138, 140 are formed within the glass via cavities 402, 404, 406, 408, 410, 412. Additionally, conductor 416 is formed within the body cavity 414. In some embodiments, the glass via cavities 402, 404, 406, 408, 410, 412 and body cavity 414 are electroplated and planarized to form the TGVs 130, 132, 134, 136, 138, 140 and the conductor 416.

Figures 4E, 4F:
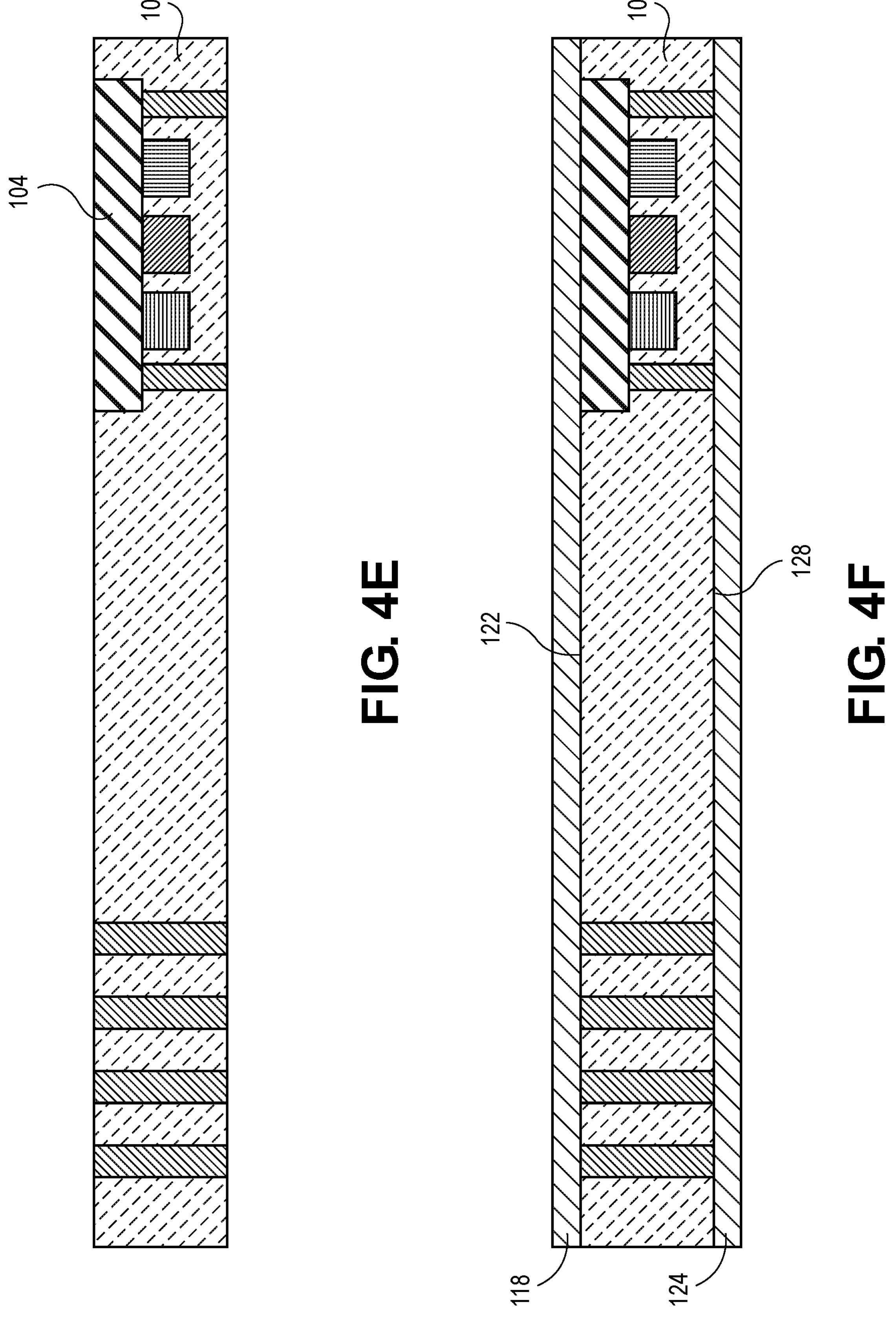

At FIG. 4E, the conductor 416 is removed to reveal the body cavity 414 and the semiconductor die 104 is placed in the body cavity 414 so that the semiconductor die 104 is partially embedded in the glass substrate 102. In some embodiments, the conductor 416 is removed through grinding.

At FIG. 4F, the SiN layer 118 is formed on the surface 122 of the glass substrate 102 and the SiN layer 124 is formed on the surface 128 of the glass substrate 102.

Figure 4G:
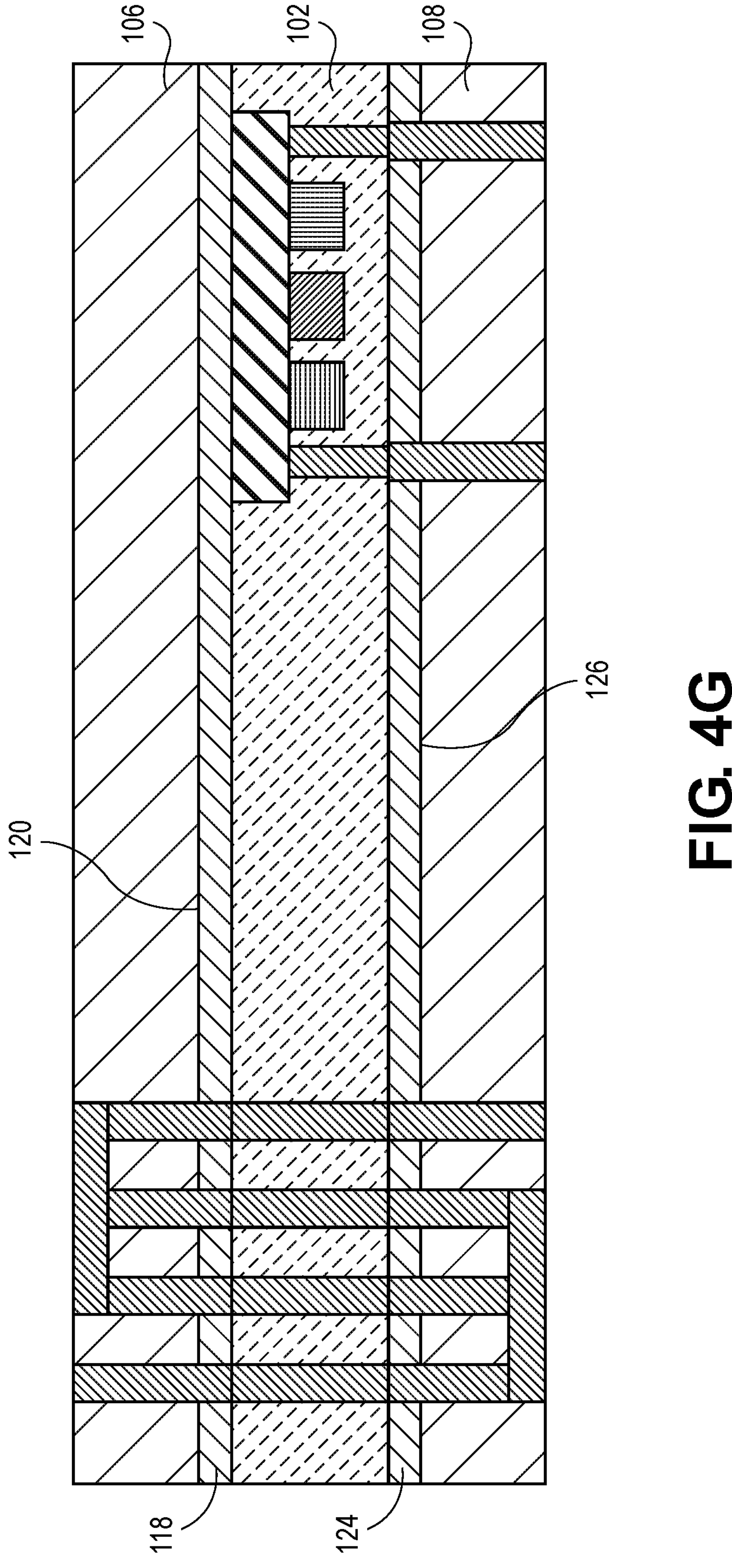

At FIG. 4G, the surface 120 of the package substrate 106 is attached to the SiN layer 118 and the surface 126 of the package substrate 108 is attached to the SiN layer 124.

FIG. 5A-5F illustrate a method of manufacturing an IC package, in accordance with some embodiments.

In some embodiments, FIG. 5A-5F describe a method of manufacturing the IC package 300 in FIG. 3.

Figures 5A, 5B:
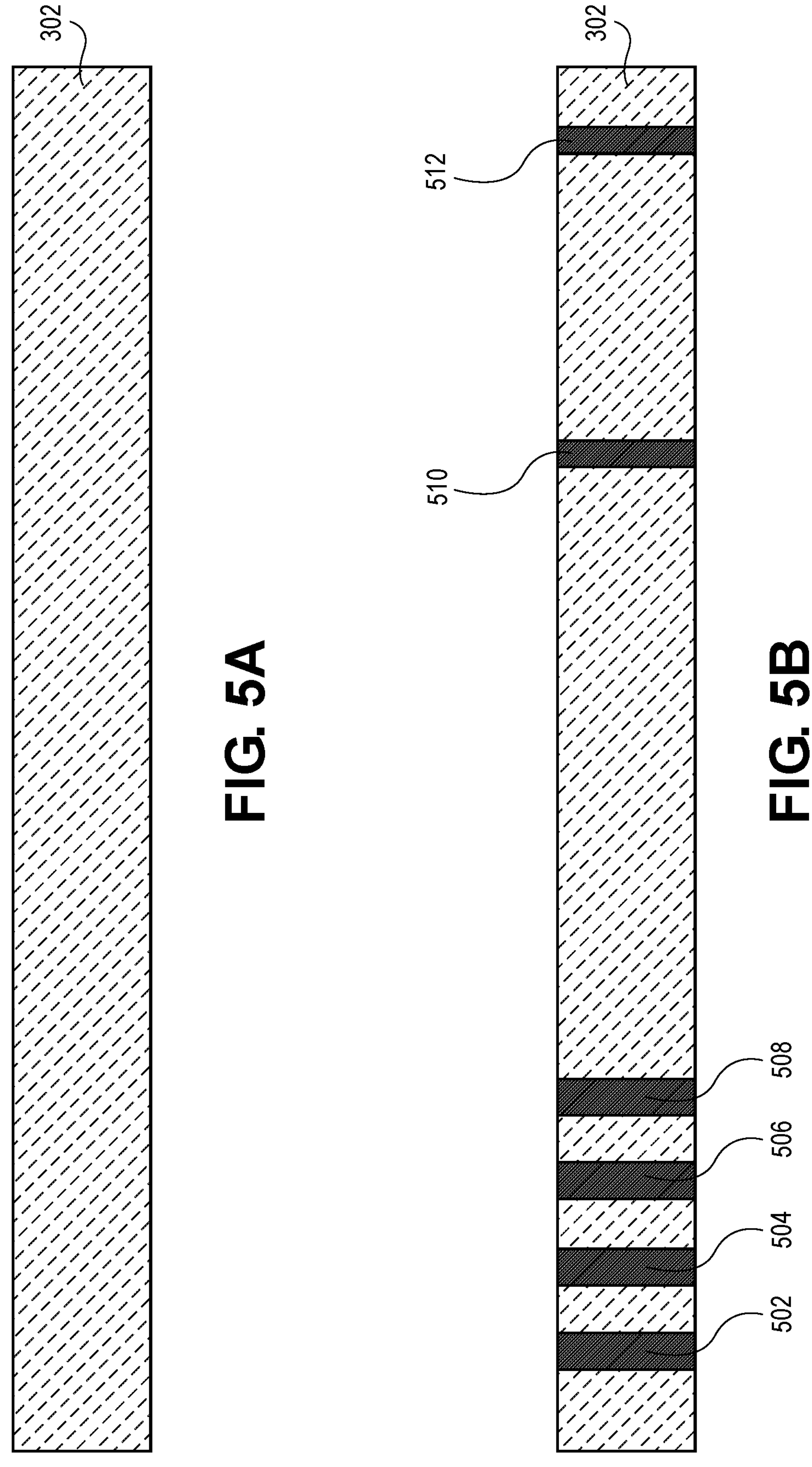
FIG. 5A-5F illustrate a method of manufacturing an IC package, in accordance with some embodiments.

At FIG. 5A, a glass substrate 302 is provided. In some embodiments, the glass substrate 302 is fabricated. In other embodiments, the glass substrate 302 is obtained from another party.

At FIG. 5B, glass via cavities 502, 504, 506, 508, 510, 512 are formed in the glass substrate 302. In some embodiments, the glass via cavities 502, 504, 506, 508, 510, 512 are formed by laser treating and etching the glass substrate 302 to form the glass via cavities 502, 504, 506, 508, 510, 512.

Figures 5C, 5D:
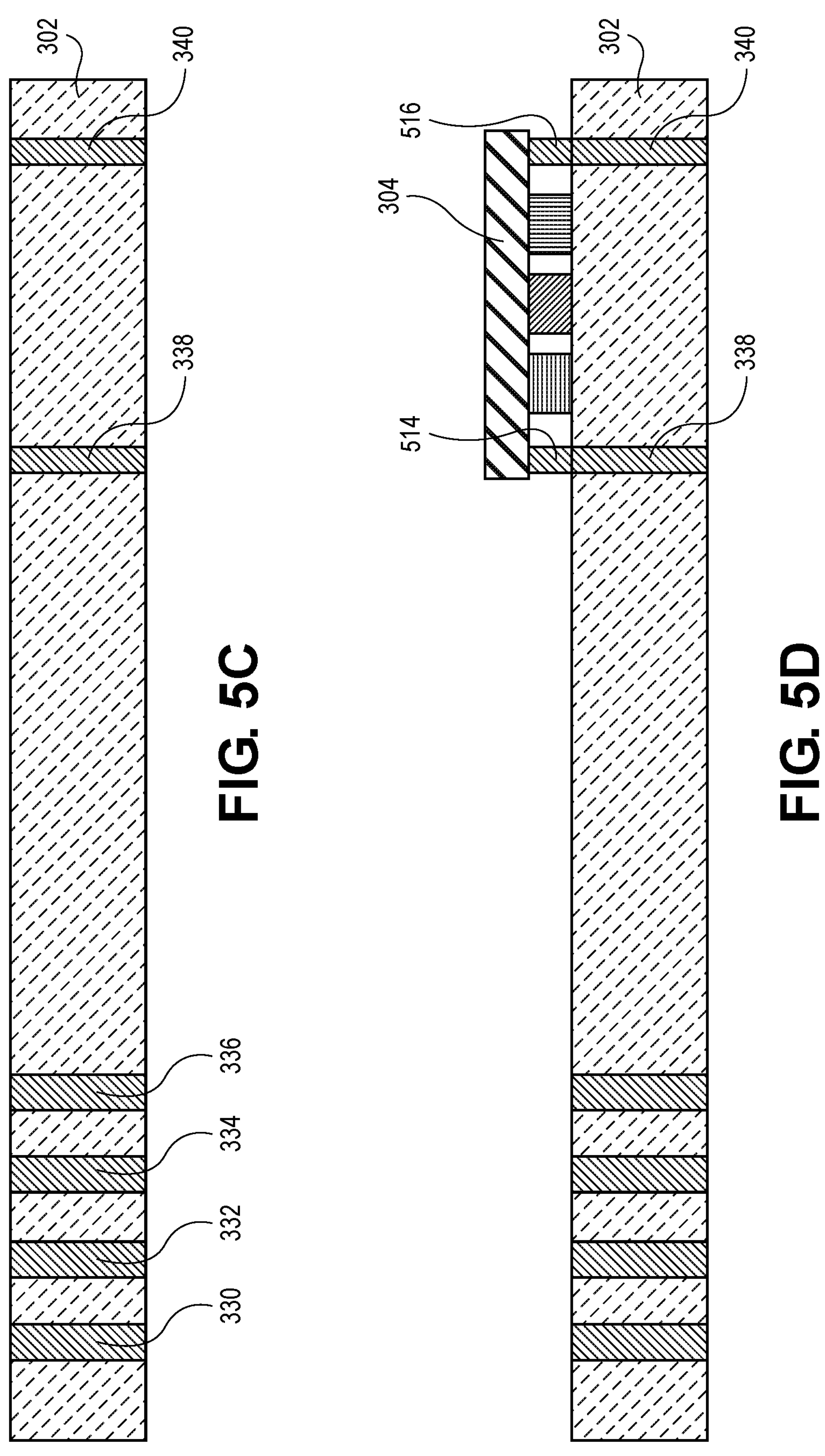

At FIG. 5C, TGVs 330, 332, 334, 336, 338, 340 are formed within the glass via cavities 502, 504, 506, 508, 510, 512. In some embodiments, the glass via cavities 502, 504, 506, 508, 510, 512 are electroplated and planarized to form the TGVs 330, 332, 334, 336, 338, 340.

At FIG. 5D, the semiconductor die 304 are positioned on and over the glass substrate 302 such that a contact 514 and a contact 516 formed over a body of the semiconductor die 304 are connected to the TGV 338 and the TGV 340 respectively.

Figure 5E:
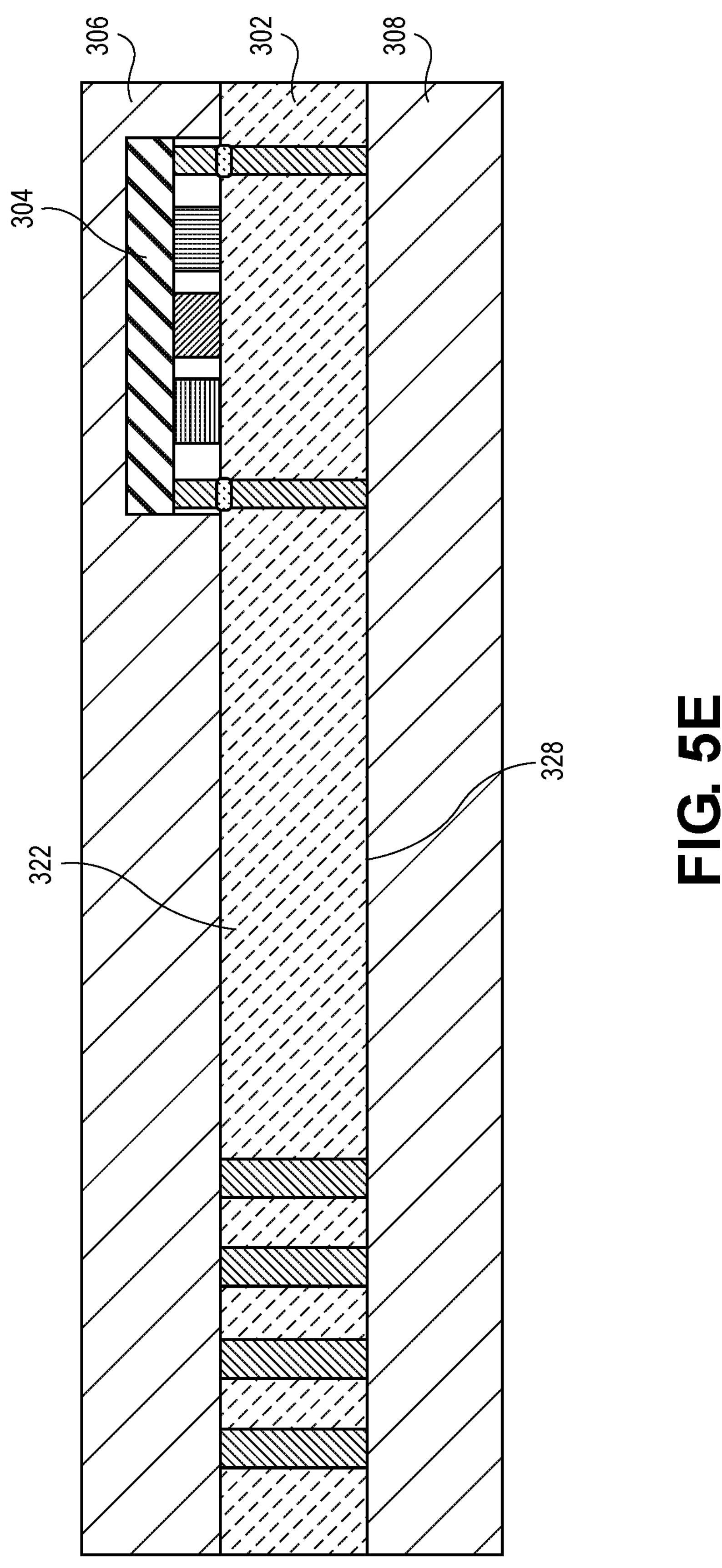

At FIG. 5E, a dielectric molding material is applied on the surface 322 of the glass substrate 302 and on the surface 328 of the glass substrate 302 to form the package substrate 306 and the package substrate 308 respectively. In this manner, the semiconductor die 304 is encased in the package substrate 306.

Figure 5F:
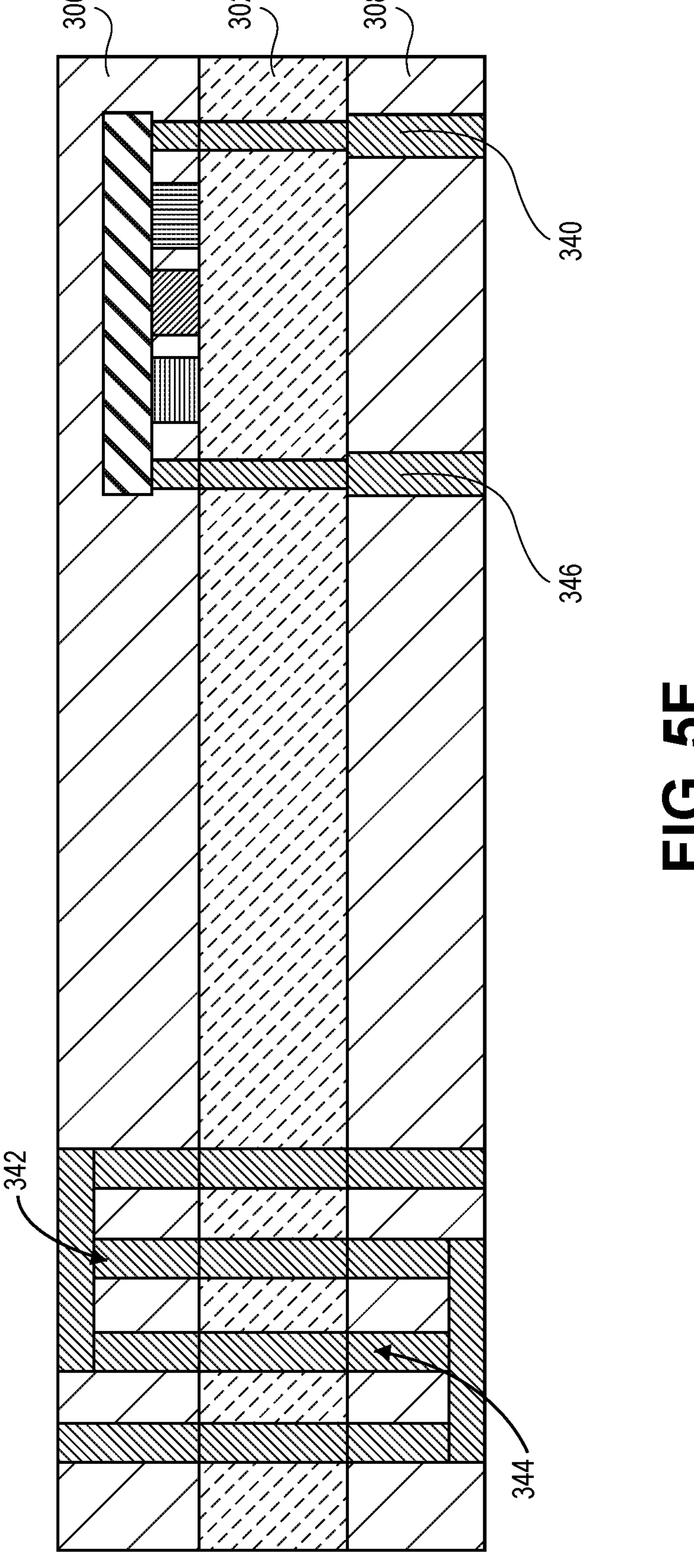

At FIG. 5F, the conductive structure 342, the conductive structure 344, and the conductive vias 340, 346 are formed in the package substrates 306, 308. Cavities are formed in the package substrates 306, 308, which are then electroplated to form the conductive structure 342, the conductive structure 344, and the conductive vias 340, 346, in accordance with some embodiments.

Figure 6:
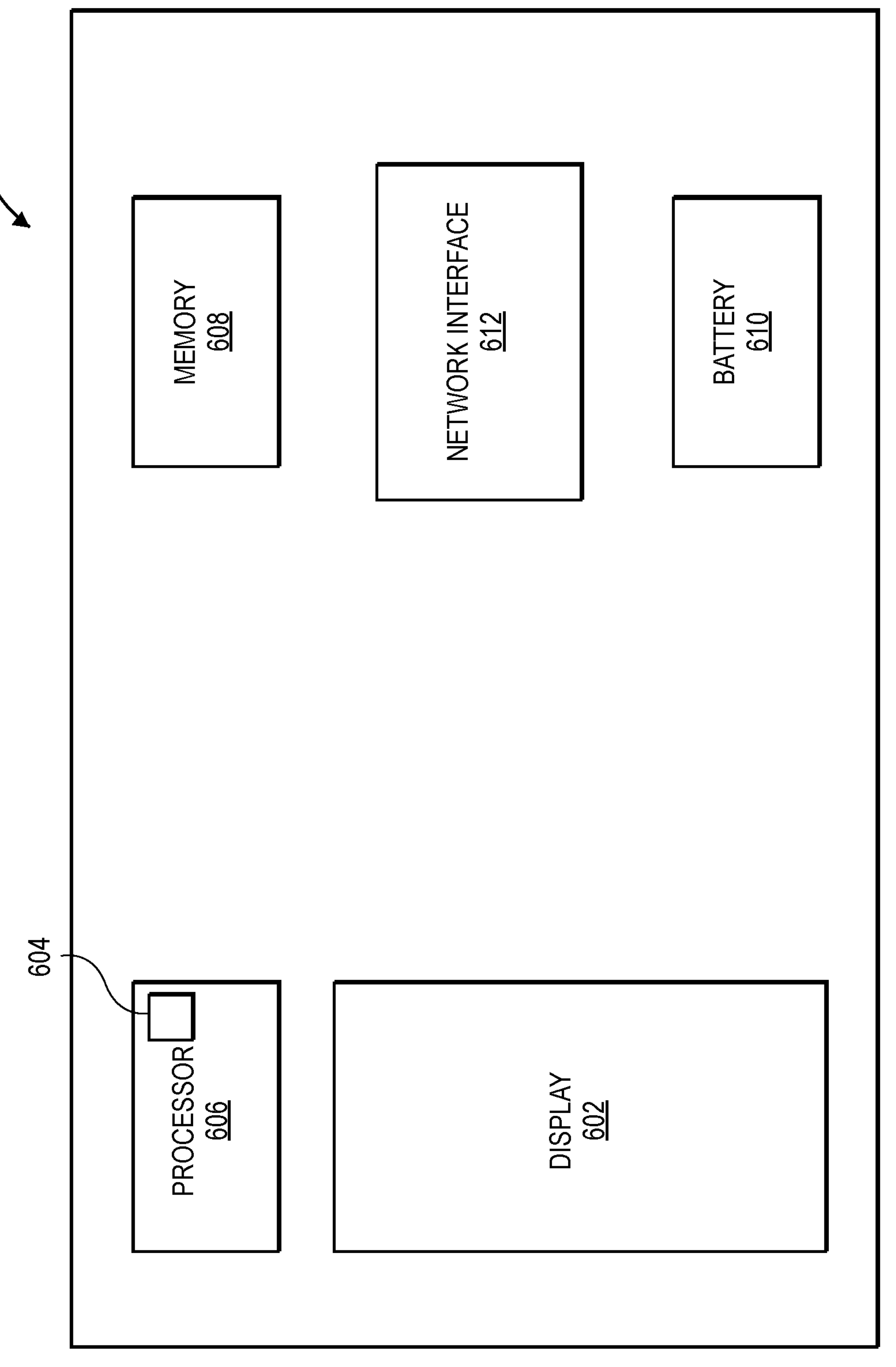
FIG. 6 is an electronic device, in accordance with some embodiments.

FIG. 6 is an electronic device, in accordance with some embodiments.

Referring to FIG. 6, an electronic device 600 has a display or display panel 602. The display may also have glass layers and other layers, circuitry, and so forth. The display panel 602 may be a micro-LED display panel. The electronic device 600 may be a mobile device such as smartphone, tablet, notebook, smartwatch, and so forth. The electronic device 600 may be a computing device, stand-alone display, television, display monitor, vehicle computer display, and/or the like. Indeed, the electronic device 600 may generally be any electronic device having a display or display panel.

The electronic device 600 may include a processor 606 (e.g., a central processing unit or CPU) and memory 608. The memory 608 may include volatile memory and non-volatile memory. The processor 606 or other controller, along with executable code store in the memory 608, may provide for touchscreen control of the display and well as for other features and actions of the electronic device 600. The processor 606 includes an IC package 604 that includes micro LEDs (i.e., micro LEDs 110, 112, 114 in FIG. 1 and FIG. 2, micro LEDs 310, 312, 314 in FIG. 3). As should be apparent, only one IC package 604 is depicted for clarity, though a processor 606 will have an array or arrays of micro LEDs on one or more IC packages 604. The processor 606 may operate the micro LEDs so that the micro LEDs visually indicate that certain functions are being performed by the processor 606 or simply for aesthetic effects.

In addition, the electronic device 600 may include a battery 610 that powers the electronic device including the display panel 602. The electronic device 600 may also include a network interface 612 to provide for wired or wireless coupling of the electronic to a network or the internet. Wireless protocols may include Wi-Fi (e.g., via an access point or AP), Wireless Direct®, Bluetooth®, and the like. Lastly, as is apparent, the electronic device 600 may include additional components including circuitry and other components.

Thus, embodiments described herein include micro light-emitting diode (LED) fabrication and assembly.

The following examples pertain to further embodiments. The various features of the different embodiments may be variously combined with some features and included and others excluded to suit a variety of different applications.

Example 1 is an integrated circuit (IC) package, comprising: a semiconductor die that includes a micro light emitting diode (LED); a glass substrate, the semiconductor die being at least partially embedded within the glass substrate and the glass substrate including a through glass via (TGV) embedded in the glass substrate wherein the TGV is electrically coupled to the semiconductor die to provide power to the micro LED; and a package substrate that is coupled to the TGV.

Example 2 is the IC package of example 1, wherein: the glass substrate defines a first length parallel to a first axis and a first thickness parallel to a second axis that is orthogonal to the first axis, the semiconductor die defines a second length parallel to the first axis and a second thickness parallel to the second axis.

Example 3 is the IC package of example 1, wherein: the glass substrate defines a first length parallel to a first axis and a first thickness parallel to a second axis that is orthogonal to the first axis, the semiconductor die defines a second length parallel to the second axis and a second thickness parallel to the first axis.

Example 4 is the IC package of example 1, wherein the TGV is directly connected to the semiconductor die.

Example 5 is the IC package of example 1, further comprising a trace, wherein: the semiconductor die includes a contact; the trace connects the TGV to the contact of the semiconductor die.

Example 6 is the IC package of example 1, wherein: the glass substrate is attached to the package substrate; a conductive via is integrated into the package substrate, wherein the conductive via is couples to the TGV.

Example 7 is the IC package of example 6, wherein the package substrate has a substrate body formed from a polymer.

Example 8 is an integrated circuit (IC) package, comprising: a semiconductor die that includes a micro light emitting diode (LED) and having a contact to receive power for the micro LED; a glass substrate, the semiconductor die is positioned over the glass substrate and the glass substrate including a through glass via (TGV) embedded in the glass substrate wherein the TGV is electrically coupled to the semiconductor die to provide power to the micro LED; and a package substrate, wherein the semiconductor die is at least partially embedded in the package substrate.

Example 9 is the IC package of example 8, wherein: the glass substrate defines a first length parallel to a first axis and a first thickness parallel to a second axis that is orthogonal to the first axis, the semiconductor die defines a second length parallel to the first axis and a second thickness parallel to the second axis.

Example 10 is the IC package of example 8, wherein the TGV is directly connected to the contact of the semiconductor die.

Example 11 is the IC package of example 8, wherein the package substrate is a first package substrate and the IC package further comprises a second package substrate and wherein: the glass substrate defines a first surface and a second surface, wherein the second surface is opposite the first surface; the TGV is exposed from the first surface and from the second surface; the second package substrate is positioned under and on the second surface, the second package substrate includes a conductive via embedded in the second substrate that is directly connected to the TGV from the second surface.

Example 12 is the IC package of example 11, wherein: the first package substrate has a first substrate body formed from a molding; the second package substrate has a second substrate body formed from the molding.

Example 13 is the IC package of example 12, wherein further comprising: a mirror embedded in the glass substrate so as to reflect light from the micro LED through the glass substrate and out of the IC package.

Example 14 is a method of manufacturing an integrated circuit (IC) package, comprising: providing a semiconductor die that includes a micro light emitting diode (LED); embedding the semiconductor die at least partially within a glass substrate; forming a through glass via (TGV) embedded in the glass substrate such that the TGV is electrically coupled to the semiconductor die to provide power the micro LED; and providing a package substrate; coupling the package substrate to the TGV.

Example 15 is the method of example 14, wherein: the glass substrate defines a first length parallel to a first axis and a first thickness parallel to a second axis that is orthogonal to the first axis, the semiconductor die defines a second length parallel to the first axis and a second thickness parallel to the second axis.

Example 16 is the method of example 14, wherein: the glass substrate defines a first length parallel to a first axis and a first thickness parallel to a second axis that is orthogonal to the first axis, the semiconductor die defines a second length parallel to the second axis and a second thickness parallel to the first axis.

Example 17 is the method of example 14, wherein the TGV is directly connected to the semiconductor die.

Example 18 is the method of example 14, further comprising: forming a conductive via integrated into the package substrate; attaching the package substrate to the package substrate so that the conductive via is coupled to the TGV.

Example 19 is the method of example 18, wherein the package substrate has a substrate body formed from a polymer.

Example 20 is the method of example 14, wherein the glass substrate defines a first surface and a second surface opposite to the first surface and the package substrate comprises a first package substrate, the method further comprising: attaching the first package substrate on and under the first surface; attaching a second package substrate on and over the second surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

What is claimed is:

1. An integrated circuit (IC) package, comprising:

a semiconductor die having a micro light emitting diode (LED) attached thereto;

a glass substrate, the semiconductor die being at least partially embedded within the glass substrate and the glass substrate including a through glass via (TGV) embedded in the glass substrate wherein the TGV is electrically coupled to and in contact with the semiconductor die to provide power to the micro LED; and a package substrate that is coupled to the TGV.

2. The IC package of claim 1, wherein:

the glass substrate defines a first length parallel to a first axis and a first thickness parallel to a second axis that is orthogonal to the first axis, the semiconductor die defines a second length parallel to the first axis and a second thickness parallel to the second axis.

3. The IC package of claim 1, wherein:

the glass substrate defines a first length parallel to a first axis and a first thickness parallel to a second axis that is orthogonal to the first axis, the semiconductor die defines a second length parallel to the second axis and a second thickness parallel to the first axis.

4. The IC package of claim 1, wherein the TGV is directly connected to the semiconductor die.

5. The IC package of claim 1, further comprising a trace, wherein:

the semiconductor die includes a contact;

the trace connects the TGV to the contact of the semiconductor die.

6. The IC package of claim 1, wherein:

the glass substrate is attached to the package substrate;

a conductive via is integrated into the package substrate, wherein the conductive via is coupled to the TGV.

7. The IC package of claim 6, wherein the package substrate has a substrate body formed from a polymer.

8. A method of manufacturing an integrated circuit (IC) package, comprising:

providing a semiconductor die having a micro light emitting diode (LED) attached thereto;

embedding the semiconductor die at least partially within a glass substrate;

forming a through glass via (TGV) embedded in the glass substrate such that the TGV is electrically coupled to and in contact with the semiconductor die to provide power the micro LED; and providing a package substrate;

coupling the package substrate to the TGV.

9. The method of claim 8, wherein:

the glass substrate defines a first length parallel to a first axis and a first thickness parallel to a second axis that is orthogonal to the first axis, the semiconductor die defines a second length parallel to the first axis and a second thickness parallel to the second axis.

10. The method of claim 8, wherein:

the glass substrate defines a first length parallel to a first axis and a first thickness parallel to a second axis that is orthogonal to the first axis, the semiconductor die defines a second length parallel to the second axis and a second thickness parallel to the first axis.

11. The method of claim 8, wherein the TGV is directly connected to the semiconductor die.

12. The method of claim 8, wherein the glass substrate defines a first surface and a second surface opposite to the first surface and the package substrate comprises a first package substrate, the method further comprising:

attaching the first package substrate on and under the first surface;

attaching a second package substrate on and over the second surface.

13. The method of claim 8, further comprising:

forming a conductive via integrated into the package substrate attaching the package substrate to the glass substrate so that the conductive via is coupled to the TGV.

14. The method of claim 13, wherein the package substrate has a substrate body formed from a polymer.

* * * * *